United States Patent [19]

Balter

[11] Patent Number: 4,768,911
[45] Date of Patent: Sep. 6, 1988

[54] DEVICE FOR MOVING OBJECTS WITHIN AND BETWEEN SEALED CHAMBERS

[75] Inventor: Valentin Balter, Cupertino, Calif.

[73] Assignee: Huntington Mechanical Laboratories, Inc., Mountain View, Calif.

[21] Appl. No.: 91,963

[22] Filed: Sep. 1, 1987

[51] Int. Cl.$^4$ ............................................. B25J 1/00
[52] U.S. Cl. ........................................ 414/3; 74/110;
269/55; 269/61; 294/86.41; 414/751; 901/19; 901/23
[58] Field of Search ................... 414/749, 750, 751, 3;
901/19, 23, 26; 269/61, 55; 74/110; 294/86.41;
403/DIG. 1

[56] References Cited

U.S. PATENT DOCUMENTS

| | | | |
|---|---|---|---|
| 2,973,107 | 2/1961 | Cherel | 414/3 |
| 4,118,943 | 10/1978 | Chellis | 74/110 X |
| 4,319,864 | 3/1982 | Kaufeldt | 414/751 X |
| 4,618,124 | 10/1986 | Flowers | 254/134.3 |

*Primary Examiner*—Robert J. Spar
*Assistant Examiner*—Donald W. Underwood
*Attorney, Agent, or Firm*—David Pressman

[57] ABSTRACT

A sample transfer device (10) for manipulating a sample (S) in a pair of sealed vacuum chambers (18, 102) comprises a tubular housing (12) made from a magnetically permeable material. The housing has one closed end (14) and another flanged open end (16) for attachment to the vacuum chamber. Located inside the housing is shaft (40) of a square cross section. One end of the shaft is rotatingly connected to an inner permanent magnet (66) which can rotate with respect to the shaft but moves axially together therewith. The other end of the shaft protrudes from the housing into the vacuum chamber (110). The shaft is supported inside the housing by a bevel gear (32) which rotates in a bearing (20) in the housing. The bevel gear (32) has a square opening (38) which guides the above-mentioned square shaft during its axial movements. The gear (32) engages another gear (98) which is attached to an output shaft of a rotary drive unit (80) having its drive element outside the housing. The device can transfer a sample from one chamber to another and can position the sample in either chamber in any desired axial or angular orientation for treatment or measurement. In the illustrated embodiment, the sample is shown as a silicon substrate subjected to ion beam implantation in one chamber and to formation of a pattern by a CVD process in another chamber.

19 Claims, 2 Drawing Sheets

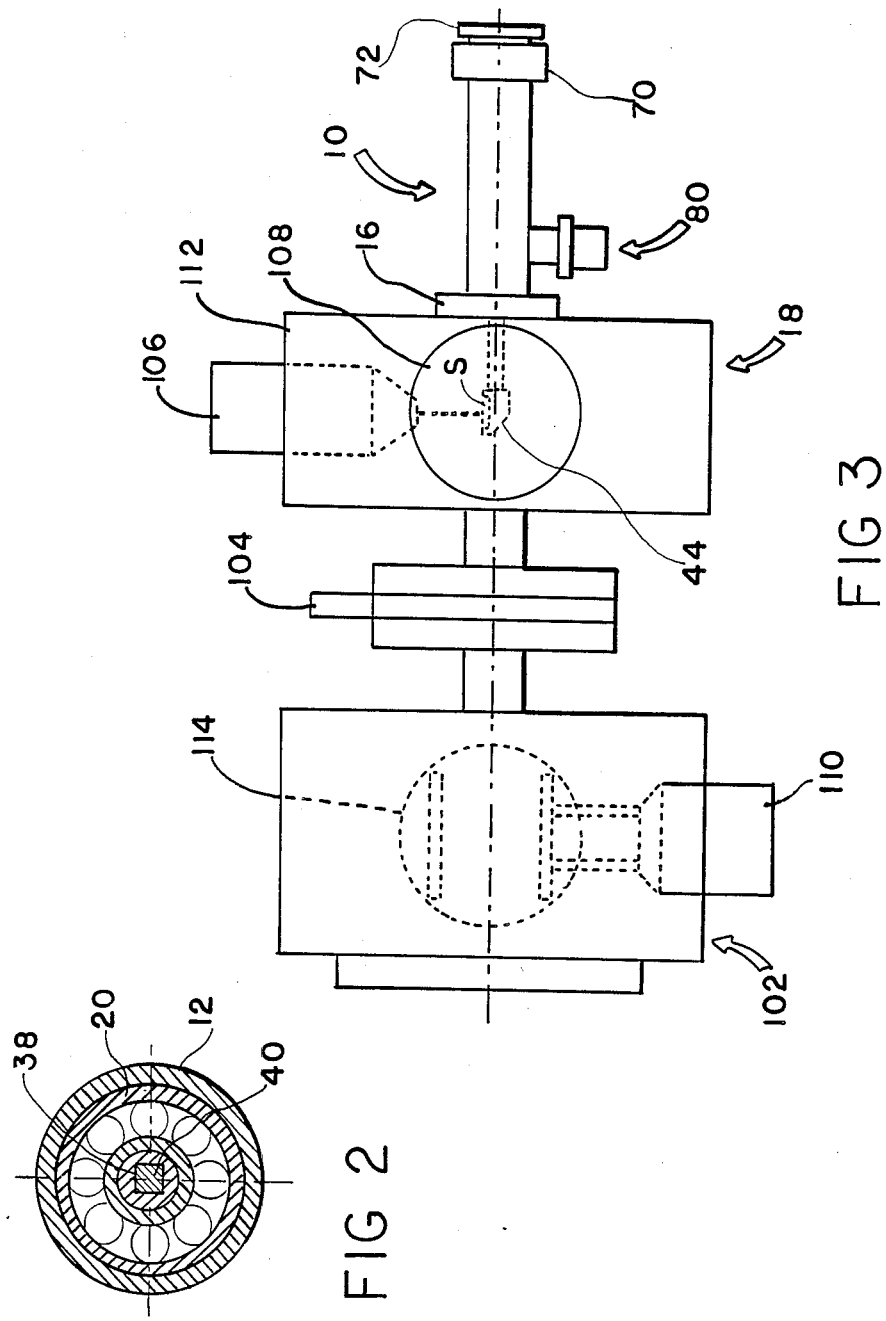

DEVICE FOR MOVING OBJECTS WITHIN AND BETWEEN SEALED CHAMBERS

BACKGROUND

1. Field of the Invention

The present invention relates to a device for moving or transferring objects within a chamber or between sealed chambers, specifically to such a device which combines rotary and translatory motions and can move samples within a vacuum deposition chambers or can transfer samples from one vacuum chamber to another.

2. Cross-References to Related Applications

My U.S. patent application Ser. No. 865,233, filed May 20, 1986, now U.S. Pat. No. 4,683,763, and entitled "Rotary-Motion Feed-Through Apparatus" and my other U.S. patent application Ser. No. 008,661, filed Jan. 1, 1987 and entitled "Gate Valve with Camming Wedge and Pressure Equilizer" cover devices which are closely related to the present invention.

3. Description of the Problem

It is often desirable or necessary to move objects within a closed chamber, such as a vacuum chamber. Such movement usually is done by a shaft which extends into the chamber so that translatory and rotary motions can be imparted into the chamber via the shaft from outside the chamber. The chamber should remain sealed at all times so as to constitute a closed system. This is especially true in vacuum chambers where it would be clearly impractical to shut the system down merely to rotate the shaft or move it in an axial direction.

One example of the need to move objects within a vacuum chamber occurs when it is necessary or desirable to change the position of a semiconductive substrate or test specimen with respect to a measuring instrument or ray emitting device, such as an electron beam gun which is located in predetermined axial and angular positions with respect to the substrate. Feed-through mechanisms or manipulators have been known and used in the past for these purposes.

One such mechanism is described in U.S. Pat. No. 2,973,107 to G. Cherel, 1961. The mechanism comprises a manipulator for sealed chambers in which rotary and translatory motions are transmitted, via rotatable and axially moveable magnets, to a holder which carries an object. One magnet is attached to a driving element outside the chamber and another to a driven element inside the chamber. Movements of the outside magnet are controlled via geared shafts.

Although the use of magnets eliminates seals and sliding parts, Cherel's device has a very complicated design and can provide displacements for only small distances and rotation within only small angles. Cherel's device is not a universal or self-contained device and is intended only for a specific application. In other words, it is not compatible with any other system and cannot be replaced by other similar devices or installed in field. Also the control element of this device uses complicated movements and is designed specially for manual control operations. Therefore Cherel's device is unsuitable for automatic, programmed control.

OBJECTS AND ADVANTAGES OF THE PRESENT INVENTION

Therefore several objects of the present invention are to provide a sample transfer device which can move samples in within a sealed chamber, has a universal and interchangeable construction, is portable, can be attached to any sealed chamber under field conditions, provides long longitudinal strokes and unlimited rotation, and is not connected mechanically to any restricting external or internal elements. Another object is to provide a device of the type referred to above in which a translatory motion mechanism can be combined with various interchangeable rotary units, or can be connected to a programmed control mechanism which will control the translatory motion and rotary motion of the sample in accordance with a predetermined program. Further objects and advantages will become apparent from the accompanying drawings and description.

DRAWINGS

FIG. 2 is a cross-sectional view taken along line II—II in FIG. 1.

FIG. 3 shows a device of the invention used in a system which consists of two vacuum chambers.

REFERENCE NUMERALS USED IN THE DRAWINGS

Figure 1:
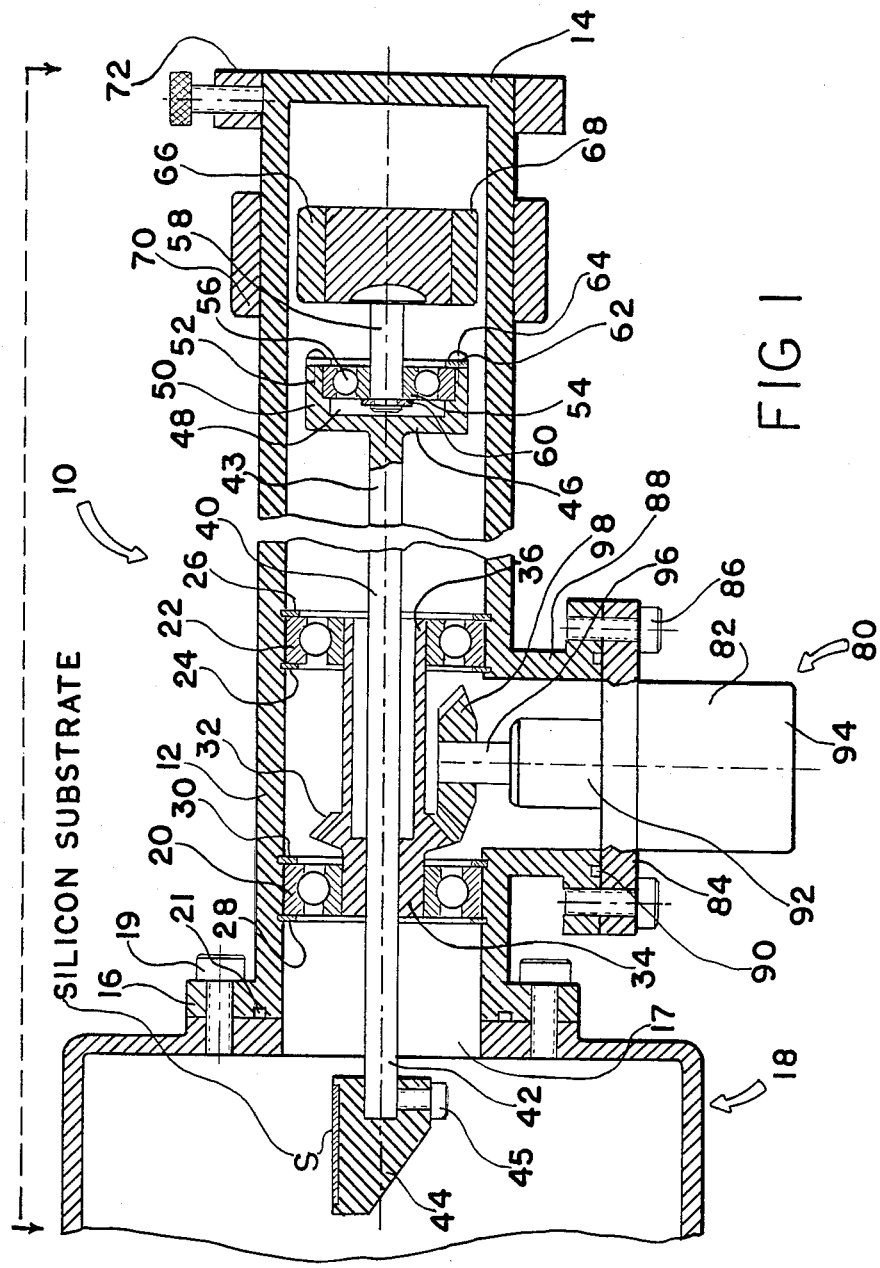
FIG. 1 is a longitudinal sectional view of a sample transfer device of the invention in a position attached to a sealed chamber.

10—sample transfer device
12—housing
14—bottom
16—flange
17—opening
18—sealed chamber
19—bolt
20, 22, 50—ball bearing
21—O-ring
24, 26, 28 30—stop rings
32—bevel gear
34—front portion of gear 32
36—rear portion of gear 32
38—central through hole
40—square shaft
42—front end of shaft 40
43—rear end of shaft 40
44—sample holder
45—bolt
46—holder
48—recess
52—outer race of bearing
54—inner race of bearing
56—balls
58—drive shaft
60, 62—stop rings
64—screws
66—inner permanent magnet
68—gap
70—outer permanent magnet
72—adjustable stopper
80—rotary-motion unit
82—housing of unit 80
84—flange
86—bolt
88—projecting portion of housing 12
90—copper O-ring
92—stationary part of housing 82
94—rotating head of housing 92
96—output shaft
98—bevel gear
102—second vacuum chamber 104—gate valve
106—ion beam implantation unit
108—door of first chamber
110—CVD apparatus
112—housing
114—door of second chamber.

FIG. 1—CONSTRUCTION OF A SAMPLE TRANSFER DEVICE

A sample transfer device 10 of the invention (FIG. 1) has a tubular cylindrical housing 12 made of a magnetically-permeable material, such as non-magnetic stainless steel. The right side of housing 12 is closed by an end 14 (hereinafter termed a bottom). The opposite side is open and has a flange 16 for attachment to a sealed chamber 18 over an area where the chamber has an opening 17. Flange 16 can be attached by bolts 19. Such a chamber may comprise, for example, an ion beam implantation vacuum chamber. To seal the connection between flange 16 and chamber 18, an O-ring 21, e.g., of a copper, is positioned between flange 16 and chamber 18.

A pair of ball bearings 20 and 22 are installed in housing 12 and fixed in an axial direction by two respective sets of two holding rings each, 28–30 and 24–26. Bearings 20 and 22 rotatingly support a bevel gear 32. The latter has a front hub portion 34, which is supported by ball bearing 20, and a hollow, rear hub portion 36, which is supported by ball bearing 22. Front hub portion 34 has a central through hole 38. As is shown in FIG. 2, hole 38 has a square cross section and serves as a guide for a square shaft 40. Shaft 40 extends through most of housing 12 and into chamber 18. Its square cross-section provides a sliding fit within hole 38. Thus, shaft 40 rotates together with bevel gear 32, but can slide axially with respect to this gear.

A front end 42 of shaft 40 projects through opening 17 into sealed chamber 18, or to any other sealed chamber to which the device can be attached by flange 18.

Front or projecting end 42 of shaft 40 may carry a sample holder 44. The construction and attachment of holder 44 is beyond the scope of the present invention. It can be any sample holder suitable for particular application, for example, for holding a silicon substrate S which is subjected to ion implantation and then to the formation of wiring pattern by deposition in a chemical vapor deposition chamber. chamber. In the illustrated embodiment, holder 44 is locked to shaft 40 by a bolt 45.

A rear end 43 of shaft 40 (opposite to end 42) has a cupshaped bearing holder 46 whose diameter is larger than shaft 40. Recess 48 of holder 46 faces bottom 14 and receives a ball bearing 50 which has an outer race 52, an inner race 54, and balls 56.

A drive shaft 58 of a round cross section is inserted into inner race 54 and projects slightly beyond (to the left of) inner race 54. A stop ring 60 is installed on the projecting portion of shaft 58. In order to fix shaft 58 against axial displacements with respect to cup-shaped portion 46, and hence shaft 40, outer ring 52 of bearing 50 is locked by a stop ring 62. Stop ring 62 can be attached to the front end of holder, for example, by screws 64.

Drive shaft 58 is rigidly connected to an inner permanent magnet 66. For example, magnet 66 may have a ring-shaped configuration and may be press-fitted onto enlarged portion 59 of shaft 58. Inner magnet 66 is made, for example, from the rare-earth sintered alloy samarium cobalt. The outer diameter of magnet 66 is smaller than the inner diameter of tubular housing 12 to provide a gap 68, preferably of about 1 mm, between housing 12 and magnet 66. This gap is necessary to allow magnet 66 to slide free within housing 12 so that a contactless positive connection is obtained between both magnets.

An annular outer permanent magnet 70 is made of the same material as inner magnet 68 and also has a ring-shaped form. Both magnets are polarized so that their magnetic lines are radially directed, i.e., for each magnet one pole is on its inner surface, and its opposite pole is on its outer surface. Outer magnet 70 is slidingly fitted to the outer surface of housing 12 so that it has a magnetic interaction with inner permanent magnet 66 through the wall of housing 12 and gap 68. As a result, axial movements of outer magnet 68 will be transmitted through a magnetic attraction force to inner magnet 66 and hence to holder 46 on the end of shaft 40. As stated, shaft 40 slides through square hole 38 into sealed chamber 18 and can move sample holder 44 with sample S to any axial position.

An extreme rear (righthand) position of the outer magnet is limited by an adjustable stop 72 which can be fixed on housing 12, for example, by a bolt 74 in any axial position on tubular housing 12.

ROTARY-MOTION UNIT

Another essential feature of the invention is that shaft 40 can also be rotated. For this purpose, device 10 has a rotary-motion unit 80 (also shown in FIG. 3). Unit 80 has a housing 82 (FIG. 1) with a flange 84 which is attached by bolts 86 to the end face of a projecting portion 88 of housing 12. A seal, such as a copper O-ring 90, is positioned between flange 84 and projecting portion 88. Housing 82 of unit 80 consists of two parts: a stationary part 92 which is integral with flange 84 and is located inside housing 12 of the device, and a rotating head 94 which is located outside housing 12. Any rotation of head 94 is kinematically transmitted through a special gear mechanism (not shown) to an output shaft 96 of 80 unit which carries a bevel gear 98. Bevel gear 98 is meshes with bevel gear 32 so that rotation of external part 94 of unit 80 is transmitted via bevel gears 90 and 32 to shaft 40 and hence to sample holder 44.

The construction of unit 80 is beyond the scope of the present invention and is described in my above-mentioned patent application Ser. No. 865,233.

FIG. 3—TWO-CHAMBER SYSTEM

A two-chamber system with which the device of the invention can be used is shown in FIG. 3. The system consists of two vacuum chambers, i.e., a first vacuum chamber 18 and a second vacuum chamber 102. Both chambers are properly sealed in a manner known in the art and are connected to each other via a gate valve 104. One gate valve suitable for this purpose is described in my above U.S. patent application Ser. No. 8,661. First chamber 18 contains has an ion-beam implantation unit 106 controlled from outside the chamber. The construction of this ion-beam implantation unit is beyond the scope of the present invention. It is located in a predeterined position so that the path of ions emitted from this device can intersect sample S fixed on holder 44. Chamber 18 has a transparent door 108 for access to the chamber and for observation of the position of sample S within the chamber. Door 108 can be opened for attachment or replacement of holder 44 or the sample. Door 108 has sealing means (not shown) for maintaining the vacuum inside the chamber when door 108 is closed. Vacuum is induced in chambers 18 and 102 from an appropriate vacuum pump (not shown) connected to both chambers through an appropriate gate valve (not shown).

Second chamber 102 may be of the same type as chamber 18 except that it is intended for another operation, e.g., for the formation on sample S of a pattern by a Chemical Vapor Deposition (CVD) method in a manner known in the art. A chemical vapor deposition apparatus 110, e.g. a plate electrode type apparatus with supply of carrier gas and a CVD gas is located in chamber 102 and is controlled from outside the chamber. An example of such a CVD apparatus is the one described in Japanese Patent Publication (Kokoku) No. 61-51,629 published Nov. 10, 1986. This apparatus is beyond the scope of the present invention and therefore is not described in the present application. Sample holder 44 can be placed between electrodes of the abovementioned CVD apparatus for growth of a conductive material film from a gaseous phase in a manner known in the art.

The CVD apparatus in second chamber 102 can be located in an angular position different from that of ion-beam implantation device 106 in first chamber 18. The longitudinal stroke of shaft 40 is longer than distance L between unit 106 and CVD apparatus 110. Chamber 102 also has an access door 114.

OPERATION

Operation of the sample transfer device will now be described in connection with the system shown in FIG. 3. It is, however, understood that this system is given only as a example and that the invention is not limited to the system of this particular construction.

Prior to operation, sample S, e.g., a silicon substrate for an integrated circuit, is fixed in a holder 44 in a place remote from vacuum chambers 18 and 102. Gate valve 104 is closed and second chamber 102 is sealed in order to protect its interior from penetration of implantation particles generated in chamber 18 at the implantation stage. A vacuum is then created in chamber 102 from its vacuum pump (not shown).

Sample transfer device 10 is then connected to first chamber 18 by means of flange 16. Bolts 19 are tightened with a force sufficient to make a reliable seal. A vacuum is then created in chamber 18 by an appropriate vacuum pump (not shown).

Assume that shaft 40 is at a fully withdrawn position, corresponding to magnets 66 and 70 being positioned near adjustable stop 72. In this position, holder 44 is located to the right of the position shown, outside of chamber 18 and within the left side of device 10. To move holder 44 to the position shown in chamber 18, an operator manually moves outer magnet 70 forward (left) toward flange 16. This causes drive shaft 58 to move left. Since inner race 54 of the ball bearing is fixed to drive shaft 58 by stop ring 60, the thrust is transmitted to inner race 54 and through balls 50 to outer race 52. Outer race 52 in turn is fixed to holder 48 on shaft 40 so that shaft 40 also moves forward, together with sample holder 44 and sample S.

During this movement, shaft 40 is guided through the square central hole of bevel gear 32.

While moving sample S forward, the operator observes the position of sample S through transparent door 108 in order to locate sample S directly in the path of the ion beam emitted from unit 106.

The angular position of sample S can be adjusted by turning external rotating head 94 of rotary motion unit 80. Rotation of external head 94 is transmitted from bevel gear 98 to gear 32 and then to shaft 40 through the square hole 38 in gear 32. Thus rotation of head 94 causes holder 44 and sample S to rotate.

Instead of visual control of the position of the sample, housing 12 and rotating part 94 may have scales with divisions (not shown). Movements can also be performed through actuating mechanisms and pulse motors (not shown), which are program controlled.

After the positioning of sample S is completed, implantation of ions is performed in a known manner by means of ion beam implantation unit 106.

When treatment in chamber 18 is finished, the operator opens gate valve 104 and transfers sample S to second chamber 102. With gate valve 104 open, vacuum is then adjusted by both pumps to the level required for operation in second chamber 102. Similar to the case of chamber 18, the operator positions sample S with regard to the CVD apparatus 110 by linear and rotary movements. These movements are controlled by manually shifting outer magnet 70 further in the forward direction and by turning part 94 of rotary-motion unit 80.

After completion of the operation, the operator retracts shaft 40, returns holder 44 with sample S to first chamber 18, and closes gate valve 104. The operator stops the vacuum pump for first chamber 18, and after the pressure in chamber 18 returns to normal, opens door 108 of first chamber 102 and removes sample S from holder 44 for subsequent treatment or measurement. If necessary, the operator can stop both vacuum pumps to restore normal pressure in both chambers, and remove sample S through door 114 of second chamber 102.

SYNOPSIS, RAMIFICATIONS, AND SCOPE

I have thus shown a sample transfer device which can move and transfer samples within and between sealed chambers, which has universal and interchangeable construction, is portable, can be attached to any sealed chamber under field conditions, provides long longitudinal strokes and unlimited rotation, and is not connected mechanically to any restricting external or internal elements. The device combines a translatory motion mechanism with various interchangeable rotary units. It can be connected to a programmed control mechanism which will control the translatory motion and rotary motion of the sample in accordance with a predetermined program.

While the invention has been illustrated in the form of a specific embodiment shown in FIGS. 1, 2, and 3, those skilled in the art will understand that these embodiments have been given only as examples and that many other modifications are possible within the scope of the appended claims. For example, shaft 40 may have a hexagonal or triangular cross section, rather than square. A different rotary-motion unit can be used, such as a conventional angular reducer. Housing 12 may have a welded, assembled construction, or can be produced by casting. The sample transfer device itself can be used for manipulation of hazardous substances or radioactive materials rather than for vacuum application. Instead of vacuum, it can be used under pressure, or under high-temperature conditions. One, three or more chambers can be combined into a system instead of two shown in FIG. 3. The device may have different dimensions and its parts, as well as its magnets, can be formed of different materials. Electric magnets can be used instead of permanent magnets. Other means than stop rings 24, 26 and 60 can be utilized for fixation of parts against axial movements. The inner surface of the outer magnet and the outer surface of the inner magnet can be coated with layers of PFTE any other low-friction material so that gap 68 will be filled with a low-friction material to provide free sliding of moveable parts without radial play.

Therefore, the scope of the invention should be determined, not by the examples given, but by appended claims and their legal equivalents.

I claim:

1. A sample transfer device for imparting translatory and rotary motion to a sample, comprising:
   a tubular housing closed at one end thereof and open at the other end thereof:
   means located at said open end for attaching said housing to a chamber;
   elongated means located in said housing means, said elongated means being moveable axially inside said housing and being capable of rotating inside said housing, said elongated means having one end located near said closed end of said housing, and a second end protruding from said housing through said open end thereof;
   sample holding means removably attached to said protruding end of said elongated means;
   rotary motion means having a driven portion located outside said housing, driving means located inside said housing, said driven portion being kinematically engaged with said elongated means for imparting rotation thereto; and
   translatory motion means having a drive portion located outside said housing and moveable axially along said housing, and driven means located inside said housing, said driven means being rigidly connected to said first end of said elongated means, said drive portion of said translatory motion means having contactless positive connection with said translatory motion means.

2. The sample transfer device of claim 1 wherein said translatory motion drive means located outside said housing comprises an outer permanent magnet which slides over the surface of said housing, and wherein said translatory motion driven means located inside said housing comprises an inner permanent magnet which has a polarity opposite to that of said outer permanent magnet and which is installed inside said housing with a gap large enough to provide free movement of said inner magnet inside said housing means, but small enough to transmit a force of magnetic attraction to said inner magnet from said outer magnet, said contactless positive connection between said translatory motion drive means and said translatory motion driven means comprising forces of magnetic attraction.

3. The sample transfer device of claim 2 wherein said outer and inner permanent magnets are made of a rare earth metal.

4. The sample transfer device of claim 3 wherein said rare earth metal is a samarium cobalt.

5. The sample transfer device of claim 1 wherein said tubular-shaped housing is made of a magnetically permeable material.

6. The sample transfer device of claim 5 wherein said magnetically permeable material is non-magnetic stainless steel.

7. The sample transfer device of claim 1 wherein said housing attachment means comprises a flange.

8. The sample transfer device of claim 7 wherein said flange has sealing means for sealing the interior of said tubular housing means when the latter is attached to said chamber.

9. The sample transfer device of claim 1 wherein said elongated means comprises a shaft which has a thrust bearing at said one end thereof, said thrust bearing allowing rotation of said shaft with respect to said inner magnet and axial movement of said magnet together with said shaft.

10. The sample transfer device of claim 1 wherein said kinematic connection of said rotary motion driven means and said elongated means comprises a first bevel gear which is attached to said rotary motion driven means, and a second bevel gear which engages said first bevel gear and is attached to said elongated means for joint rotation therewith combined with a relative axial motion of said elongated means with respect to said second bevel gear.

11. The sample transfer device of claim 1, further including adjustable stop means on said tubular housing for limiting the return stroke of said translatory motion means.

12. A sample transfer device for imparting translatory and rotary motion to a sample comprising:
   a tubular-shaped housing closed at one end and open at the other end thereof;
   a flange at said open end of said tubular housing for attaching said housing to an object;
   a plurality of bearings fixed in said tubular housing;
   a first bevel gear with a non-circular central opening rotatingly supported by said bearings in said housing;
   a shaft located in said housing and having a non-circular cross section which corresponds to said non-circular cross section of said first bevel gear opening so that said shaft will rotates with said gear and can slide axially with respect thereto in said central opening, one end of said shaft being located adjacent said closed end of said housing, the other end of said shaft protruding outside said housing though said open end thereof;
   a sample holder removably attached to said protruding end of said shaft;
   a rotary motion unit having a drive portion located outside said housing and driven portion located inside said housing, said driven means portion carrying a second bevel gear which is in mesh with said first bevel gear so that rotation of said drive portion is transmitted to said shaft;
   an inner permanent magnet rotatingly installed in said housing on said one end of said shaft with a gap between the outer surface of said inner magnet and the inner surface of said housing;
   an outer permanent magnet of a polarity opposite to that of said inner magnet, said outer magnet is slidingly installed on said housing so that it can move said inner magnet inside said housing through the forces of magnetic attraction.

13. The sample transfer device of claim 12 wherein said outer and inner permanent magnets are made of a rare earth metal.

14. The sample transfer device of claim 13 wherein said rare earth metal is samarium cobalt.

15. The sample transfer device of claim 12 wherein said tubular-shaped housing is made of a magnetically permeable material.

16. The sample transfer device of claim 15 wherein said magnetically permeable material is stainless steel.

17. The sample transfer device of claim 12 wherein said flange has sealing means for sealing the interior of said tubular housing means when the latter is attached to said chamber.

18. The sample transfer device of claim 12 further having an adjustable stop means on said tubular housing means for limiting the return stroke of said outer permanent magnet.

19. The sample transfer device of claim 12 wherein said non-circular cross section is a square cross section.

* * * * *